United States Patent [19]
Takano et al.

[11] Patent Number: 5,670,458
[45] Date of Patent: Sep. 23, 1997

[54] OXIDE SUPERCONDUCTOR AND METHOD FOR PRODUCING THE SAME

[75] Inventors: Mikio Takano, Kyoto; Zenji Hiroi, Uji; Yasuo Takeda, Tsu; Toshio Takada, deceased, late of Kyoto; by Komichi Takada, administrator, Kyoto; by Jun Takada, administrator, Okayama; by Kei Takada, administrator, Kyoto, all of Japan

[73] Assignees: Seisan Kaihatsu Kagaku Kenkyusho; NEC Corporation, both of Japan

[21] Appl. No.: 598,040

[22] Filed: Feb. 7, 1996

Related U.S. Application Data

[63] Continuation of Ser. No. 248,204, May 24, 1994, abandoned.

[30] Foreign Application Priority Data

Jun. 2, 1993 [JP] Japan .................. 5-131778

[51] Int. Cl.$^6$ .............. H01B 12/00; C04B 35/01; C04B 35/057; H01L 39/12
[52] U.S. Cl. .............. 505/125; 505/100; 505/776; 252/521; 428/688; 428/701; 428/702
[58] Field of Search ................. 505/100, 125, 505/126, 776; 252/518, 521; 428/688, 701, 702

[56] References Cited

U.S. PATENT DOCUMENTS

| | | | |
|---|---|---|---|
| 4,983,575 | 1/1991 | Komuro | 505/701 |
| 5,021,659 | 6/1991 | Schneider | 505/849 |

OTHER PUBLICATIONS

Adachi et al "High pressure synthesis of superconducting Sr–Ca–Cu–O samples" Physica C, 208, 1993 (May) pp. 226–230.

Eriksson et al "Oxygen Content and Structural Properties of Ba–Cu Oxides" Physica C, 162–164, 1989 pp. 59–60.

Zhang et al. "Phase diagram of barium–copper–oxygen and yttrium–copper–oxygen . . . " Funtai oyobi, Kyoto Univ. 37(1), 1990, pp. 122–126, (Abstract Only).

Bando, Advances in Superconductivity V, Nov. 1992, ISTEC pp. 211–226.

Geballe, "Paths to Higher Temperature Superconductors" Science vol. 259, Mar. 12, 1993, pp. 1550–1551.

Hiroi, Nature 364, Jul. 22, 1993 pp. 315–317.

Hiroi, Physica C vol. 208 (1993) No. 3–4, Apr. 10, 1993 pp. 286–296.

*Primary Examiner*—Paul Lieberman
*Assistant Examiner*—Mark Kopec
*Attorney, Agent, or Firm*—Wenderoth, Lind & Ponack

[57] ABSTRACT

An oxide superconductor having a composition of the formula: $A_{n+1}Cu_nO_{2n+1+\delta}$ in which A is at least one alkaline earth metal element selected from the group consisting of calcium, strontium and barium, n is an integer of at least one, and $\delta$ is a number larger than 0 and not larger than 1, a laminate structure in which a layer having a partial composition of $A_2O_{1+\delta}$ and a layer having a partial composition of $A_{n-1}Cu_nO_{2n}$ are alternately laminated, and a superconductive critical temperature equal to or higher than the liquid nitrogen temperature.

6 Claims, 8 Drawing Sheets

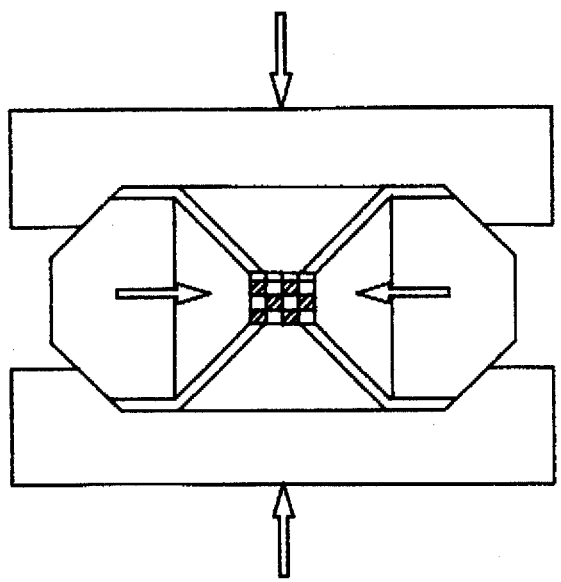
FIG. IA
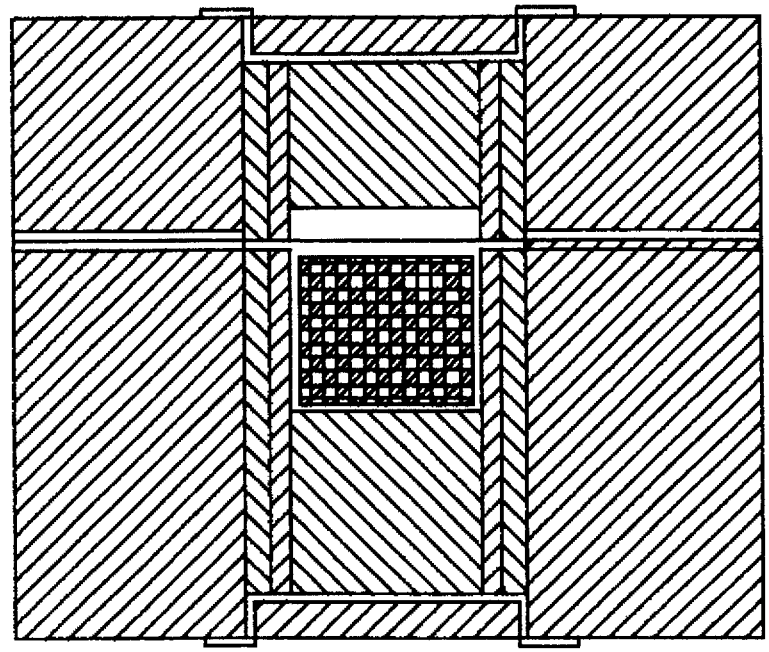
FIG. IB

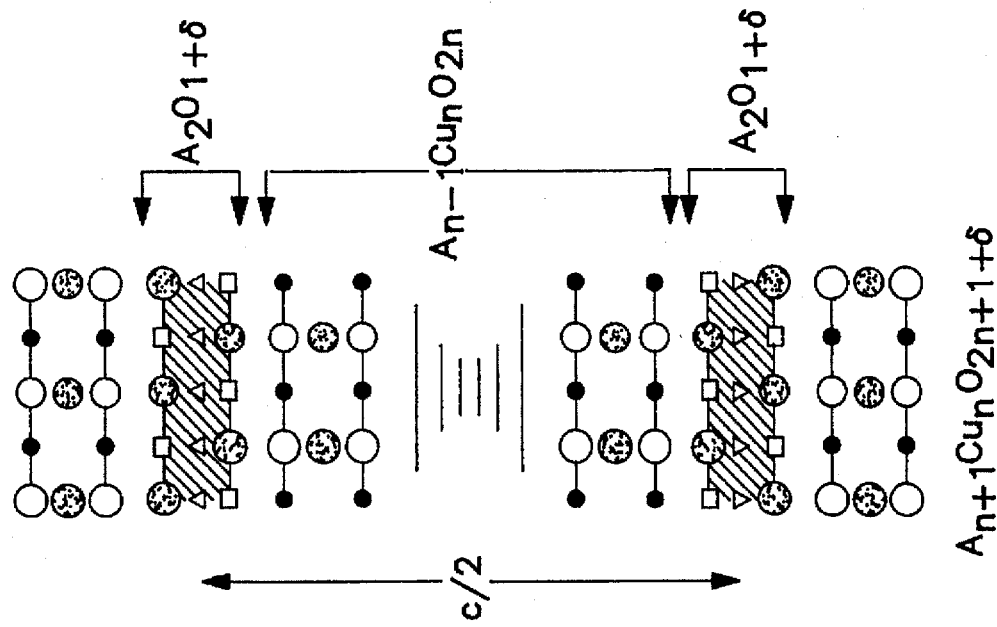
FIG. 3D  $A_{n+1}Cu_nO_{2n+1+\delta}$
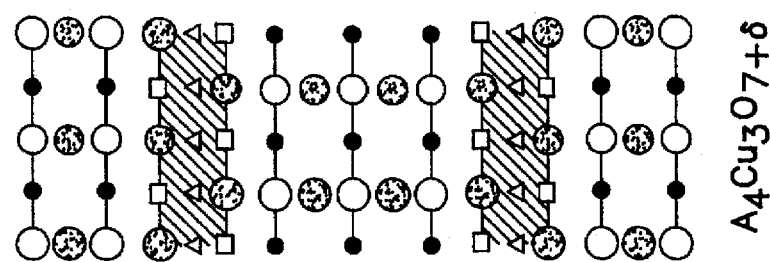
FIG. 3C  $A_4Cu_3O_{7+\delta}$
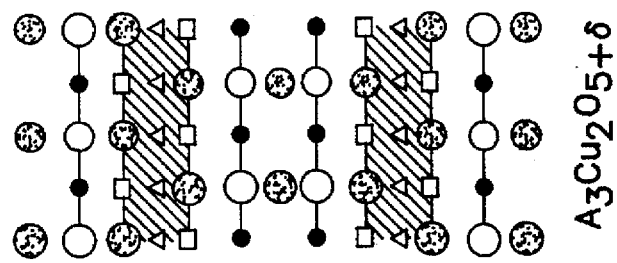
FIG. 3B  $A_3Cu_2O_{5+\delta}$
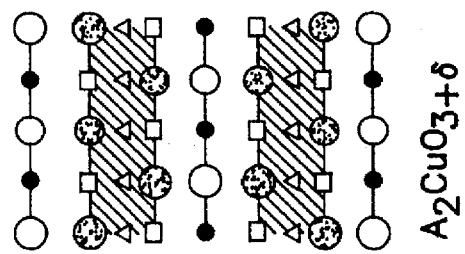
FIG. 3A  $A_2CuO_{3+\delta}$

OXIDE SUPERCONDUCTOR AND METHOD FOR PRODUCING THE SAME

This application is a Continuation application of now abandoned application, Ser. No. 08/248,204, filed May 24, 1994, now abandoned.

BACKGROUND OF THE INVENTION

1. Field of the Invention

The present invention relates to an oxide superconductor having a high superconductive critical temperature (Tc) and a method for producing the same.

2. Description of the Related Art

In these years, copper oxide superconductors having a Perovskite crystal structure or a related crystal structure, for example, $YBa_2Cu_3O_{7-\delta}$ have been studied and developed extensively, and some materials having a superconductive critical temperature (Tc) higher than the liquid nitrogen temperature have been found.

SUMMARY OF THE INVENTION

One object of the present invention is to provide a copper oxide high temperature superconductor which comprises cheap and nontoxic elements, has a Tc equal to or higher than the liquid nitrogen temperature and is not denatured with water, while the conventional copper oxide superconductors contain expensive rare earth elements or toxic lead or thallium.

Another object of the present invention is to provide a method for producing such oxide superconductor.

According to a first aspect of the present invention, there is provided an oxide superconductor having a composition of the formula:

$$A_{n+1}Cu_nO_{2n+1\delta} \qquad (1)$$

wherein A is at least one alkaline earth metal element selected from the group consisting of calcium, strontium and barium, n is an integer of at least one, and δ is a number larger than 0 and not larger than 1 (one), and a laminate structure in which a layer having a partial composition of $A_2O_{1+\delta}$ and a layer having a partial composition of $A_{n-1}Cu_nO_{2n}$ are alternately laminated, and having a superconductive critical temperature equal to or higher than the liquid nitrogen temperature.

According to a second aspect of the present invention, there is provide a method for producing an oxide superconductor of the present invention comprising encapsulating a composition of oxides of the alkaline earth metal A and copper, an oxide mixture containing at least two of those elements, or an oxide comprising all of those metal elements, which composition has a composition formula:

$$A_{n+1}Cu_nO_{2n+1 +\delta} \qquad (11)$$

wherein A, n and δ are the same as defined above and optionally an oxidizing agent which is thermally decomposed to generate oxygen in an oxygen gas-impermeable metal capsule and reacting said composition and optionally the oxidizing agent at a high temperature under high pressure.

The addition of the oxidizing agent will increase the excess oxygen content in the sample, namely the number δ, in comparison with the starting composition.

Preferably, the pressure is from 2 to 10 GPa and the temperature is from 800° to 1000° C.

BRIEF DESCRIPTION OF THE DRAWINGS

FIG. 1 schematically shows a cross section of an ultra high pressure generator to be used in Examples, FIG. 3 illustrates fundamental crystal structures of $Sr_2CuO_{3+\delta}$ (a), $Sr_3Cu_2O_{5+\delta}$ (b), $Sr_4Cu_3O_{7+\delta}$ (c) and $Sr_{n+1}Cu_nO_{2n+1+\delta}$ (d)

DETAILED DESCRIPTION OF THE INVENTION

Figure 2:
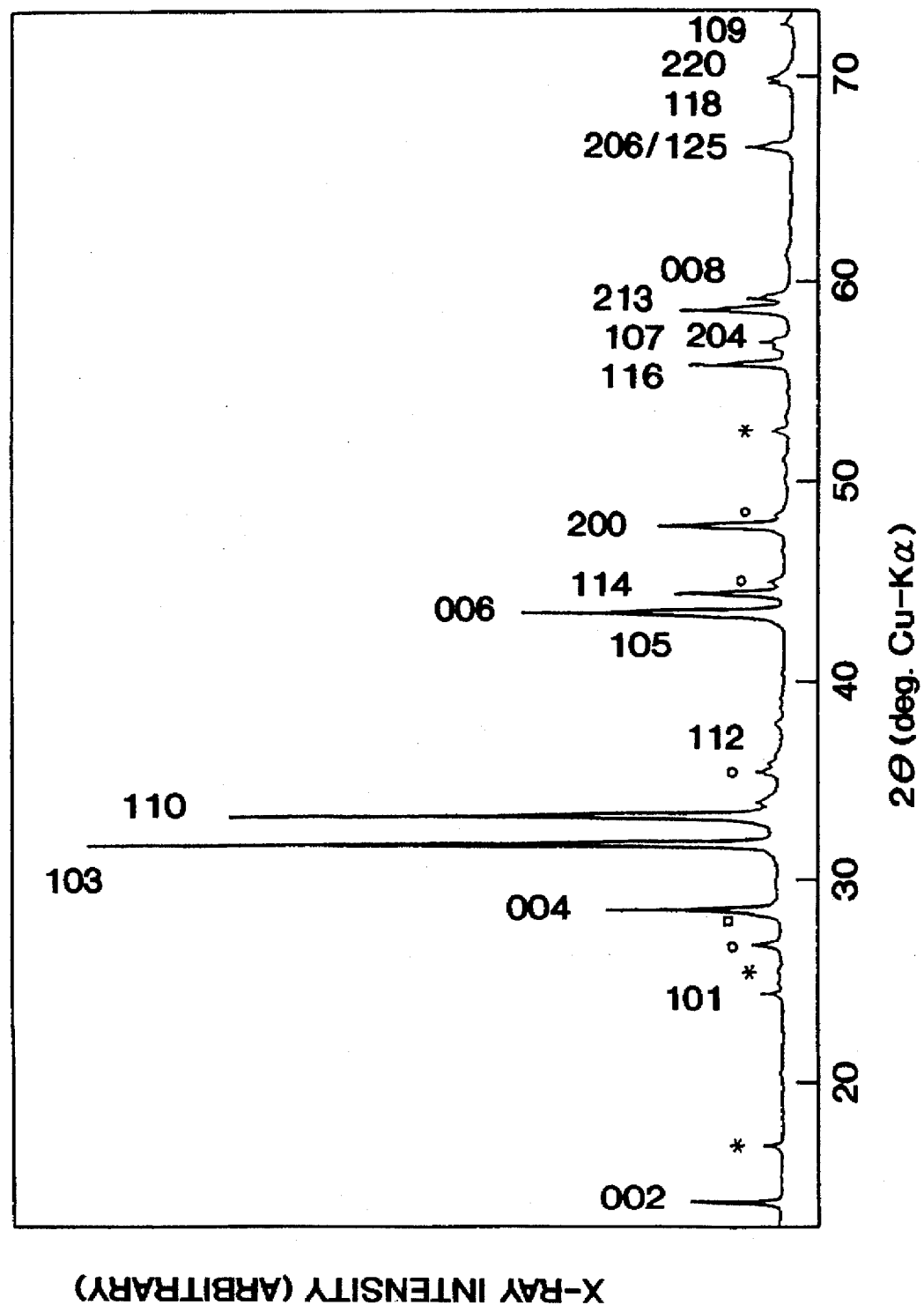
FIG. 2 is an X-ray diffraction pattern of the $Sr_2CuO_{3.1}$ superconductive phase.

The oxide superconductor of the present invention includes a series of compounds having compositions and structures between one end compound of the formula: $A_2CuO_{3+\delta}$ 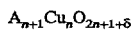 corresponding to the formula (I) wherein n is 1 and the other end compound of the formula: $ACuO_2$ corresponding to the formula (I) wherein n is infinite.

The compound of the formula: $ACuO_2$ has the oxygen defective Perovskite crystal structure of, for example, $Ca_{0.84}Sr_{0.14}CuO_2$ under the high pressure (cf. M. Takano, Y. Takeda, H. Okada, M. Miyamoto and K. Kusaka, Physica, C159 (1989) 375).

The copper oxide superconductor of the present invention has the composition represented by the formula:

$$A_{n+1}Cu_nO_{2n+1+\delta}$$

wherein A, n and δ are the same as defined above, and the structure in which a layer having a partial composition of $A_2O_{1+\delta}$ and a layer having a partial composition of $A_{n-1}Cu_nO_{2n}$ are alternately laminated. This compound has the superconductivity by implanting carriers in the $CuO_2$ planes through the introduction of excessive oxygen atoms. The number δ indicates the excessive amount of the oxygen atoms.

Such oxide high temperature superconductor may be produced by encapsulating a mixture of oxides of the alkaline earth metal or metals A and copper, an oxide mixture containing at least two of those elements, or an oxide comprising all of those metal elements in an oxygen gas-impermeable metal capsule made of, for example, gold, platinum and the like and heating it at a high temperature under high pressure, preferably at a temperature of 800° to 1000° C. under pressure of 2 to 10 GPa. To introduce the excessive oxygen, an oxidizing agent which is thermally decomposed to generate oxygen such as potassium perchlorate ($KClO_4$) or peroxides of alkaline earth metals may be encapsulated together with the raw material oxide. When the raw material oxide contains a sufficient amount of oxygen, the oxidizing agent is not used.

When the pressure is too low, the desired crystal structure may not be formed, while it is too high, a large load is applied on a synthesis apparatus so that the apparatus may be broken. Then, a pressure from 2 to 10 GPa is preferred. When the temperature is too low, the synthesis reaction hardly proceeds or the produced material may not have superconductivity, while it is too high, the oxide or oxides are molten. Then, a temperature from 800° to 1000° C. is preferred.

PREFERRED EMBODIMENTS OF THE INVENTION

The present invention will be explained further in detail by making reference to the accompanying drawings. The following Examples are not intended to limit the scope of the present invention in any way.

EXAMPLE 1

$SrCO_3$ powder and CuO powder were weighed so that an atomic ratio of Sr to Cu was 2:1, calcined in an air at 800° C. and sintered in an oxygen atmosphere at 900° C. to obtain an oxide powder. The oxide powder was encapsulated in a gold Capsule together with an oxidizing agent $KClO_4$ and treated in a cubic anvil type ultra high pressure generator shown in FIG. 1 under pressure of 6 GPa at 850° C. for 30 minutes.

The treated sample was analyzed by a powder X-ray diffraction analyzer. The result is shown in FIG. 2, from which it was found that the obtained sample was a novel high pressure-stable phase. The high pressure phase has a tetragonal symmetry and its lattice constants are a =3.765 Å and c=12.553 Å. From the precise analysis of its crystal structure, it was found that the basic structure of the high pressure phase is the $K_2NiF_4$ or $Nd_2CuO_4$ type having the oxygen defects in which the $CuO_2$ layers consisting of copper and oxygen atoms and the $Sr_2O_{1+\delta}$ layers consisting of strontium and oxygen atoms are alternately laminated in the direction of the crystallographic c axis as shown in the sketch (a) of FIG. 3.

Figure 4:
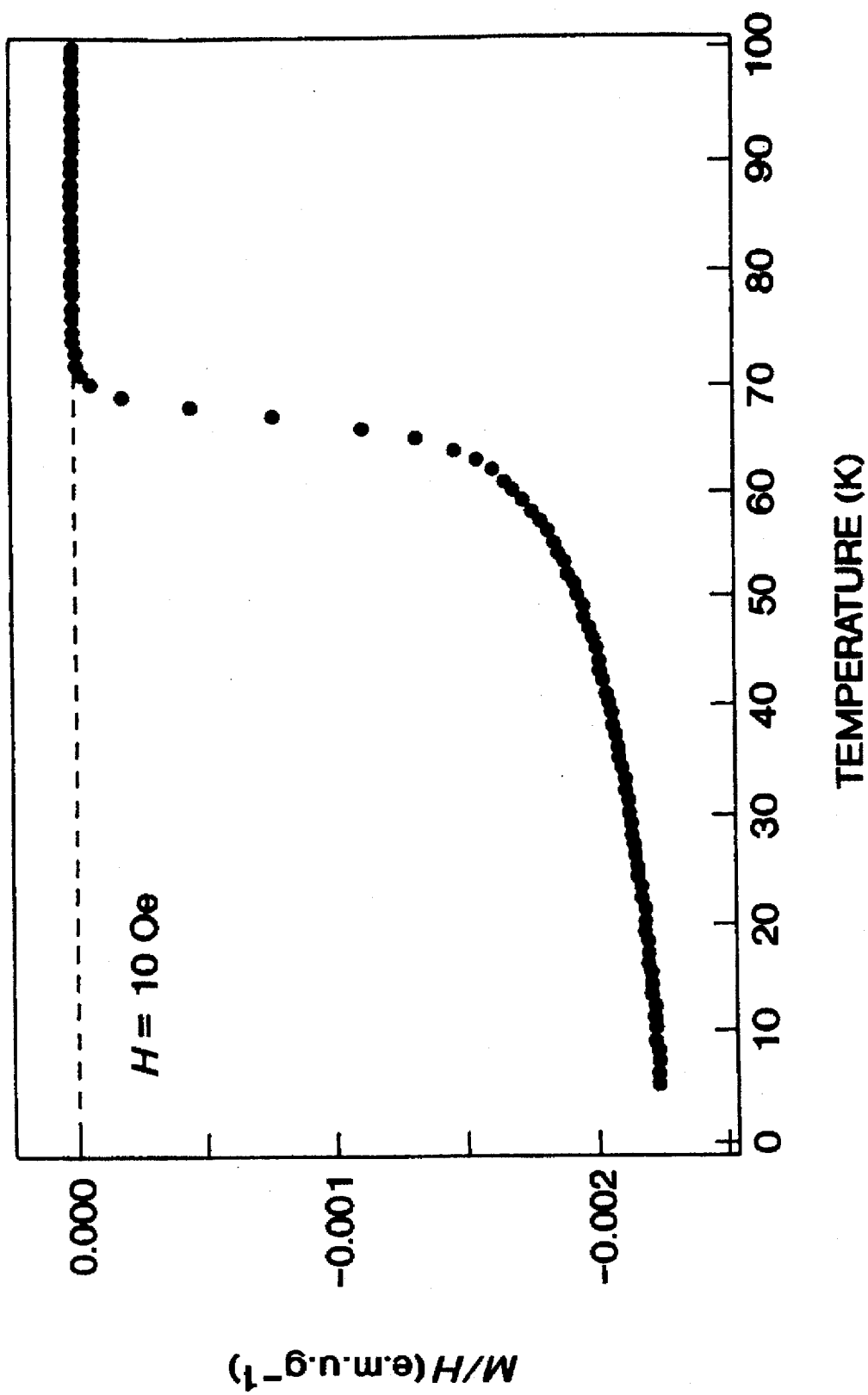
FIG. 4 is a chart showing change of magnetization of $Sr_2CuO_{3.1}$ (δ=0.1) superconductive phase depending on temperature.

To know whether or not the above treated sample had the superconductivity, the change of magnetization depending on temperature was examined. The result is shown in FIG. 4. From this result, it is confirmed that the sample has the Meissner effect due to the superconductive transition around 70 K.

As in the above measurement of magnetization, in the measurement of electric resistance, the sharp reduction of electric resistance was found from about 70 K. to the lower temperature range.

From the above results, it was concluded that the above sample was a novel oxide high temperature superconductor.

EXAMPLE 2

In the same manner as in Example 1 except that the temperature in the ultra high pressure generator was kept at 950° C., an oxide high temperature superconductor was synthesized. Its Tc was about 70 K. as in Example 1.

EXAMPLE 3

In the same manner as in Example 1 except that the raw material powders were mixed so that the atomic ratio of strontium to copper was 3:2, an oxide powder was prepared.

The oxide powder was encapsulated in a gold capsule together with an oxidizing agent $KClO_4$ and treated in the cubic anvil type ultra high pressure generator under pressure of 6 GPa at 850° C. for 30 minutes.

From the X-ray diffraction, it was found that the obtained sample was a novel high pressure-stable phase which has the tetragonal symmetry and lattice constants of a=3.902 Å and c=21.085 Å.

Figure 5:
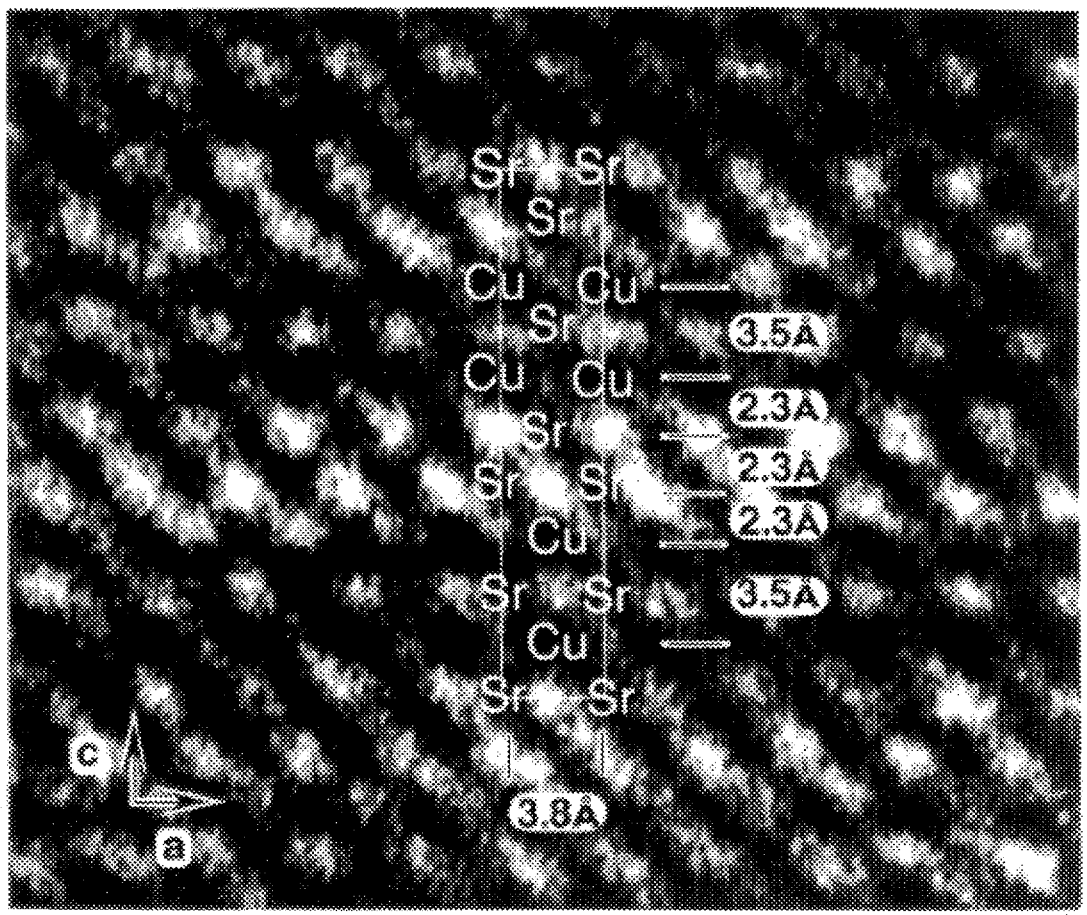
FIG. 5 is a high resolution electron microscopic photograph of the $Sr_3Cu_2O_{5+\delta}$ superconductive phase.

A high resolution electron microscopic photograph of this sample is shown in FIG. 5. From this photograph, it was found that, in the crystal structure of this high pressure phase, pairs of the $CuO_2$ layers consisting of copper and oxygen atoms each pair of which is separated by a strontium atom plane, and the $Sr_2O_{1+\delta}$ layers consisting of strontium and oxygen atoms are alternately laminated in the direction of the crystallographic c axis as shown in the sketch (b) of FIG. 3.

Figure 6:
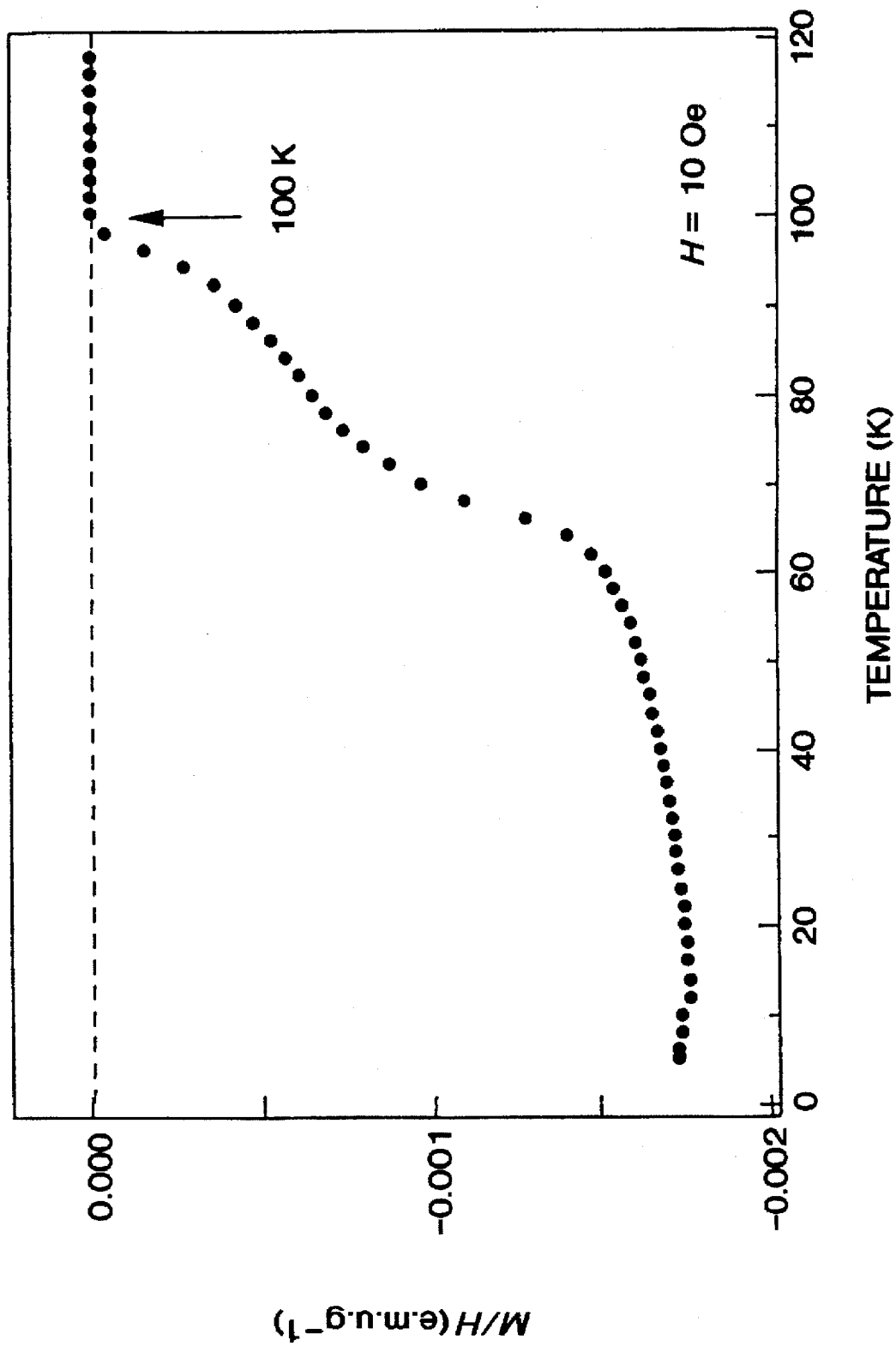
FIG. 6 is a chart showing change of magnetization of the $Sr_3Cu_2O_{5+\delta}$ superconductive phase.

To know whether or not the above treated sample had the superconductivity, the change of magnetization depending on temperature was examined. The result is shown in FIG. 6. From this result, it is confirmed that the sample has the Meissner effect due to the superconductive transition around 100 K.

As in the above measurement of magnetization, in the measurement of electric resistance, the sharp reduction of electric resistance was found from about 100 K. to the lower temperature range.

From the above results, it was concluded that the above sample was a novel oxide high temperature superconductor.

EXAMPLE 4

In the same manner as in Example 1 except that $CaCO_3$ was additionally used as a calcium source and an atomic ratio of Sr:Ca:Cu was 2.8:1.2:3.0, an oxide powder was prepared.

The oxide powder was encapsulated in a gold capsule together with an oxidizing agent $KClO_4$ and treated in the cubic anvil type ultra high pressure generator under pressure of 6 GPa at 900° C. for 30 minutes.

From the X-ray diffraction, it was found that the obtained sample was a novel high pressure-stable phase which has the tetragonal symmetry and lattice constants of a=3.90 Å, and c=27.39 Å.

From a high resolution electron microscopic photograph of this sample, it was found that, in the crystal structure of this high pressure phase, sets of the three $CuO_2$ layers consisting of copper and oxygen atoms which are separated by a strontium atom plane, and the $Sr_2O_{1+\delta}$ layers consisting of strontium and oxygen atoms are alternately laminated in the direction of the crystallographic c axis as shown in the sketch (c) of FIG. 3.

Figure 7:
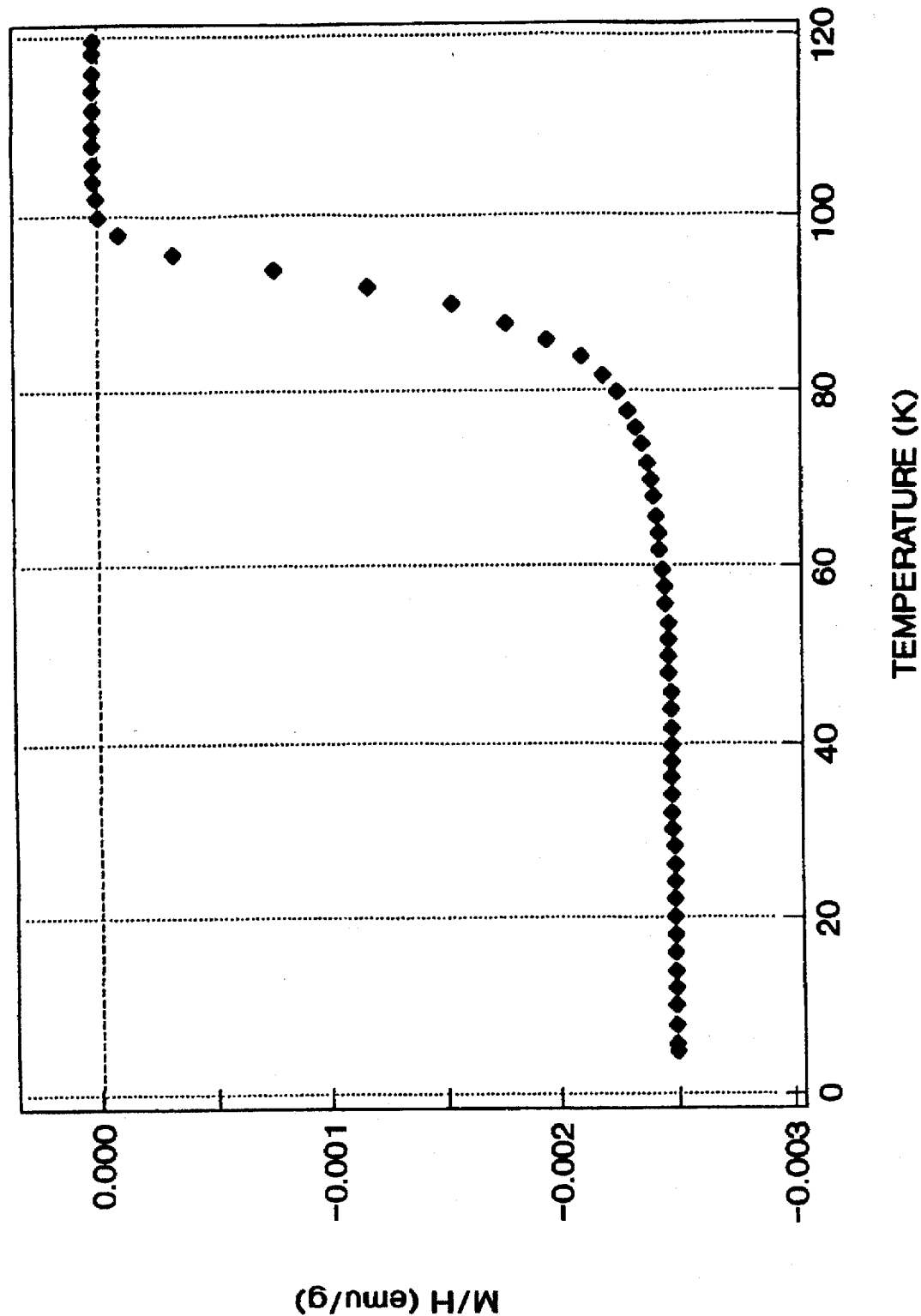
FIG. 7 is a chart showing change of magnetization of the $Sr_{2.8}Ca_{1.2}Cu_3O_{7+\delta}$ superconductive phase depending on temperature.

To know whether or not the above treated sample had the superconductivity, the change of magnetization depending on temperature was examined. The result is shown in FIG. 7. From this result, it is confirmed that the sample has the Meissner effect due to the superconductive transition around 100 K.

Figure 8:
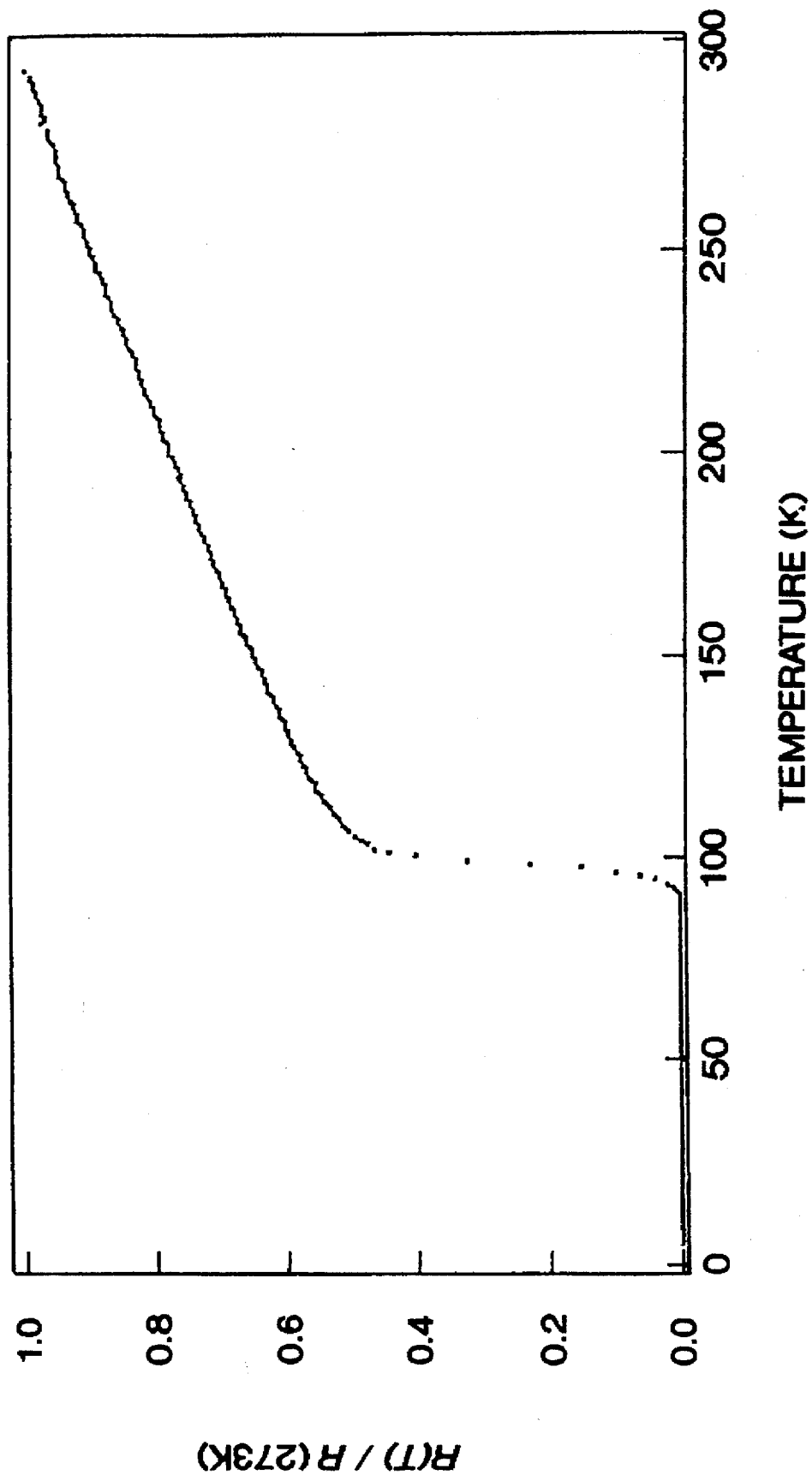
FIG. 8 is a chart showing change of electric resistance of the $Sr_{2.8}Ca_{1.2}Cu_3O_{7+\delta}$ superconductive phase depending on temperature.

As in the above measurement of magnetization, in the measurement of electric resistance the result of which is shown in FIG. 8, the sharp reduction of electric resistance was found from about 100 K. to the lower temperature range.

From the above results, it was concluded that the above sample was a novel oxide high temperature superconductor.

EXAMPLE 5

In the same manner as in Example 4 except that the atomic ratio of Sr:Ca:Cu was changed to 1.4:0.6:1 and the temperature in the ultra high pressure generator was kept at 800° C., an oxide high temperature superconductor was synthesized. Its Tc was about 70 K.

EXAMPLES 6 and 7

In the same manner as in Example 1 except that BaCO$_3$ was additionally used as a barium source and an atomic ratio of Sr:Ba:Cu was 1.4:0.6:1.0 (in Example 6) or 2.7:0.3:2 (in Example 7), an oxide powder was prepared. Then, in the same manner as in Example 1 except that the pressure and temperature in the ultra high pressure generator were changed as shown in the Table, an oxide high temperature superconductor was synthesized. The Tc was 72 K. in Example 6 or 98 K. in Example 7.

The synthesis conditions and properties of the produced superconductors in the above Examples are summarized in the Table.

Comparative Examples 1–4

In the same manner as in Example 1 except that the atomic ratio of Sr:Cu or Ca:Sr:Cu, the pressure and temperature in the ultra high pressure generator were changed as shown in the Table and no oxidizing agent was used in Comparative Examples 2 and 3, an oxide high temperature superconductor was synthesized.

The results are shown in the Table.

TABLE

| Composition $A_{n+1}Cu_nO_{2n+1+\delta}$ | Pressure (GPa) | Temp. (°C.) | Oxidizing agent | n | δ | Tc (K) |
|---|---|---|---|---|---|---|
| Examples | | | | | | |
| 1 Sr$_2$CuO$_{3+\delta}$ | 6 | 850 | KClO$_4$ | 1 | 0.10 | 70 |
| 2 Sr$_2$CuO$_{3+\delta}$ | 6 | 950 | KClO$_4$ | 1 | 0.12 | 70 |
| 3 Sr$_3$Cu$_2$O$_{5+\delta}$ | 6 | 850 | KClO$_4$ | 2 | 0.20 | 100 |
| 4 Ca$_{1.2}$Sr$_{2.8}$Cu$_3$O$_{7+\delta}$ | 6 | 900 | KClO$_4$ | 3 | 0.20 | 100 |
| 5 Ca$_{0.6}$Sr$_{1.4}$CuO$_{3+\delta}$ | 6 | 800· | KClO4 | 1 | 0.10 | 70 |
| 6 Sr$_{1.4}$Ba$_{0.6}$CuO$_{3+\delta}$ | 5 | 850 | KClO$_4$ | 1 | 0.15 | 72 |
| 7 Sr$_{2.7}$Ba$_{0.3}$Cu$_2$O$_{5+\delta}$ | 7 | 850 | KClO$_4$ | 2 | 0.15 | 98 |
| Comparative Examples | | | | | | |
| 1 Sr$_2$CuO$_{3+\delta}$ | 6 | 400 | KClO$_4$ | 1 | | *1) |
| 2 Sr$_2$CuO$_{3+\delta}$ | 6 | 850 | — | 1 | 0.01 | *2) |
| 3 Sr$_3$Cu$_2$O$_{5+\delta}$ | 6 | 850 | — | 2 | 0.01 | *2) |
| 4 CaSrCuO$_{3+\delta}$ | 7 | 1400 | KClO$_4$ | 1 | | *3) |

Note:
*1) No high pressure phase was synthesized.
*2) The sample did not exhibit superconductivity.
*3) The sample was molten.

As seen from the above results, when δ is 0 (zero), no superconductivity appears. Preferably, δ is at least 0.02.

What is claimed is:

1. An oxide superconductor having a composition of the formula:

$$A_{n+1}Cu_nO_{2n+1+\delta}$$

wherein A is at least one alkaline earth metal element selected from the group consisting of calcium, strontium and barium, n is an integer of at least one, and δ is a number in the range of 0.02 to 0.20, said oxide superconductor having a laminate structure in which a layer having a composition of $A_2O_{1+\delta}$ and a layer having a composition of $A_{n-1}Cu_nO_{2n}$ are alternately laminated, and having a superconductive critical temperature equal to or higher than 70 K.

2. The oxide superconductor according to claim 1, wherein δ is from 0.10 to 0.20.

3. An oxide superconductor according to claim 1 wherein the oxide superconductor has a superconductive critical temperature of between 70 K. and about 100 K.

4. An oxide superconductor according to claim 1 wherein n is from 1 to 3 and has a superconductive critical temperature equal to or higher than the liquid nitrogen temperature.

5. An oxide superconductor according to claim 1 produced by encapsulating a composition of oxides of the alkaline earth metal A and copper, an oxide mixture containing at least two of those elements, or an oxide comprising all of those metal elements, which composition has a composition formula:

$$A_{n+1}Cu_{n2n+1+\delta} \qquad (II)$$

wherein A, n and δ are the same as defined in claim 1 in an oxygen gas-impermeable metal capsule and reacting said composition and optionally an oxidizing agent at a temperature of from 800° to 1000° C. and at a pressure of from 2 to 10 GPa.

6. An oxide superconductor according to claim 5 wherein an oxidizing agent which is thermally decomposed to generate oxygen is encapsulated in said oxygen gas-impermeable metal capsule.

* * * * *